(12) United States Patent
Sato

(10) Patent No.: US 9,450,208 B2
(45) Date of Patent: Sep. 20, 2016

(54) ORGANIC ELECTROLUMINESCENCE DISPLAY DEVICE

(71) Applicant: Japan Display Inc., Tokyo (JP)

(72) Inventor: Toshihiro Sato, Tokyo (JP)

(73) Assignee: JAPAN DISPLAY INC., Tokyo (JP)

( * ) Notice: Subject to any disclaimer, the term of this patent is extended or adjusted under 35 U.S.C. 154(b) by 0 days.

(21) Appl. No.: 14/318,885

(22) Filed: Jun. 30, 2014

(65) Prior Publication Data

US 2015/0008407 A1 Jan. 8, 2015

(30) Foreign Application Priority Data

Jul. 3, 2013 (JP) ................... 2013-140184

(51) Int. Cl.
| | | |
|---|---|---|
| H01L 29/08 | (2006.01) | |
| H01L 35/24 | (2006.01) | |
| H01L 51/00 | (2006.01) | |
| H01L 51/52 | (2006.01) | |
| H01L 27/32 | (2006.01) | |

(52) U.S. Cl.
CPC ....... *H01L 51/5271* (2013.01); *H01L 27/3218* (2013.01)

(58) Field of Classification Search
USPC .......... 257/40, E51.026, 59, 72; 438/26, 29, 438/34, 99; 345/76
See application file for complete search history.

(56) References Cited

U.S. PATENT DOCUMENTS

| | | | | |
|---|---|---|---|---|
| 6,898,018 | B2 * | 5/2005 | Minoura et al. | 359/627 |
| 8,643,267 | B2 * | 2/2014 | Matsuura et al. | 313/504 |
| 8,664,017 | B2 * | 3/2014 | Fushimi et al. | 438/26 |
| 8,871,537 | B2 * | 10/2014 | Yoshitoku et al. | 438/29 |
| 2002/0043931 | A1 | 4/2002 | Minoura et al. | |
| 2005/0006999 | A1 | 1/2005 | Minoura et al. | |
| 2009/0021158 | A1 * | 1/2009 | Tanaka et al. | 313/504 |
| 2011/0057920 | A1 * | 3/2011 | Matsuura et al. | 345/211 |
| 2011/0285326 | A1 * | 11/2011 | Kajitani et al. | 315/312 |
| 2013/0084664 | A1 * | 4/2013 | Yoshitoku et al. | 438/34 |
| 2013/0210176 | A1 * | 8/2013 | Fushimi et al. | 438/26 |

FOREIGN PATENT DOCUMENTS

| | | |
|---|---|---|
| JP | 2002-198184 A | 7/2002 |
| JP | 2007-165331 A | 6/2007 |

* cited by examiner

*Primary Examiner* — Telly Green
(74) *Attorney, Agent, or Firm* — Typha IP LLC

(57) ABSTRACT

An organic electroluminescence display device according to the invention includes a TFT substrate, a retroreflective body formed on the TFT substrate so as to correspond to each of pixels, a plurality of organic electroluminescence elements formed on the retroreflective bodies so as to correspond to the pixels, and a pixel separation film adapted to section the pixels, and the pixel separation film is formed in an area corresponding to an area between a boundary between the pixels adjacent to each other and an outer periphery of the retroreflective body.

9 Claims, 16 Drawing Sheets

FIG.7
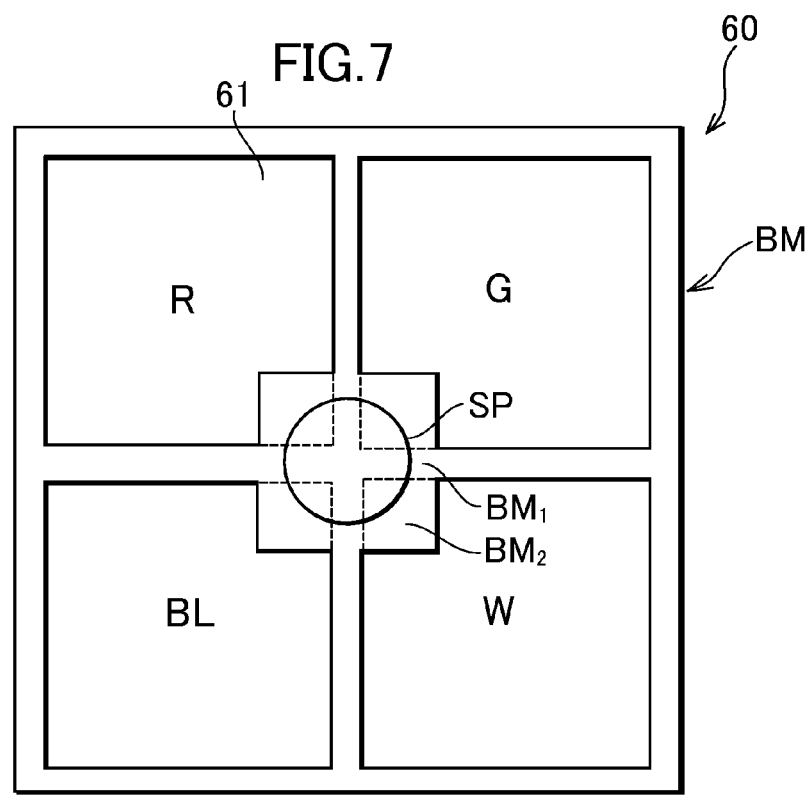
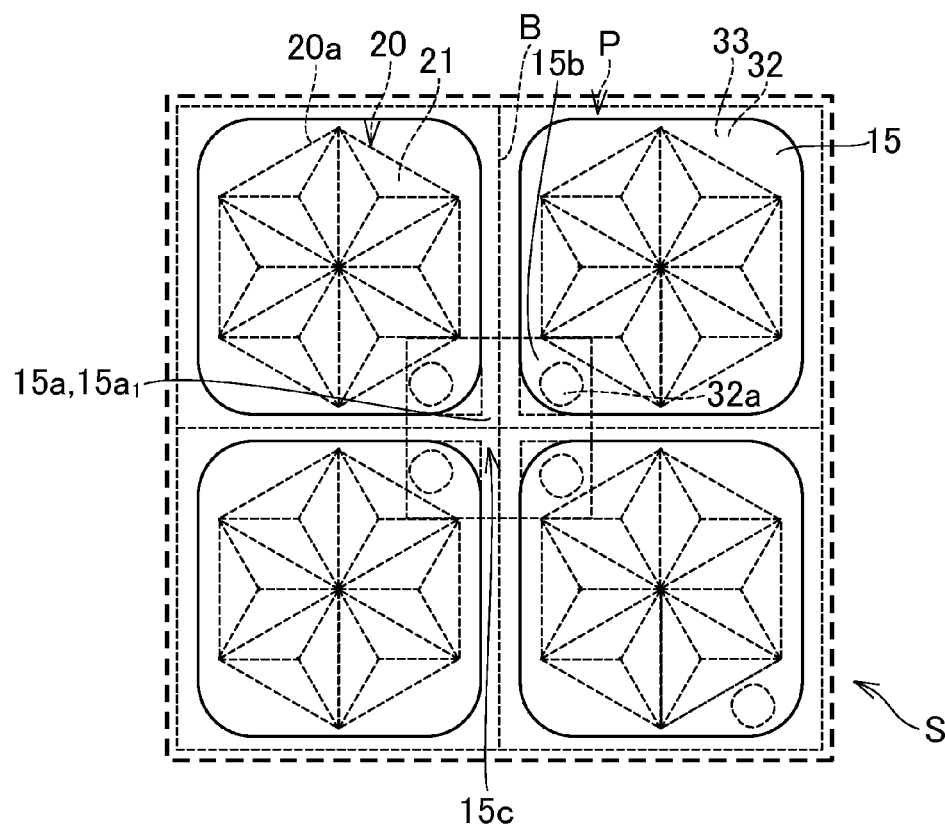

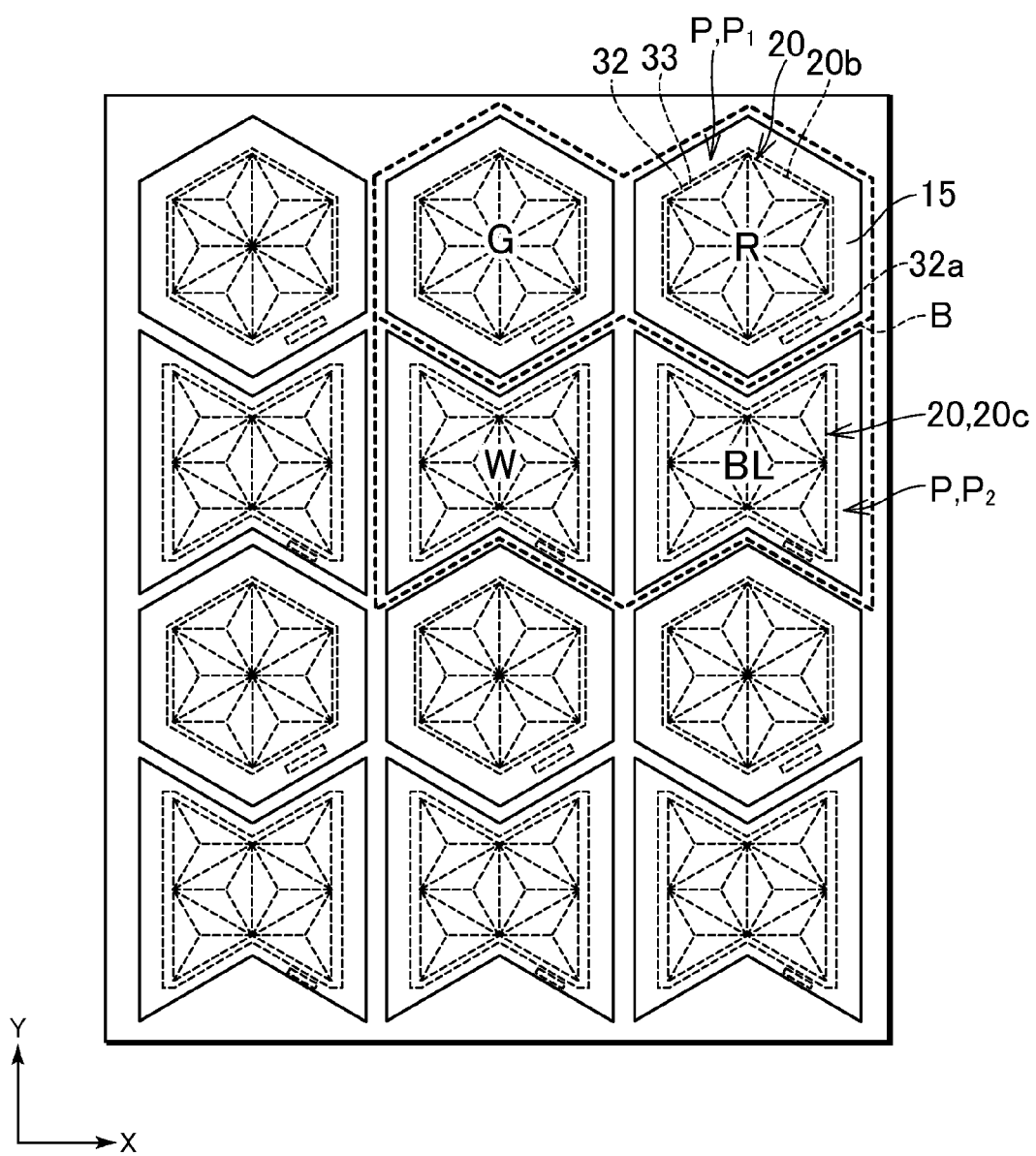

ORGANIC ELECTROLUMINESCENCE DISPLAY DEVICE

CROSS-REFERENCE TO RELATED APPLICATION

The present application claims priority from Japanese application JP2013-140184 filed on Jul. 3, 2013, the content of which is hereby incorporated by reference into this application.

BACKGROUND OF THE INVENTION

1. Field of the Invention

The present invention relates to an organic electroluminescence display device.

2. Description of the Prior Art(s)

As a low-profile and lightweight light emitting source, an organic electroluminescent element has attracted attention, and there has been developed an organic electroluminescence display device provided with a thin film transistor (TFT) substrate having a thin film transistor and a number of organic electroluminescence elements. The organic electroluminescence element has a structure having an organic layer having a light emitting layer sandwiched between an anode and a cathode.

As such an organic electroluminescence display device, there has been disclosed, for example, a configuration in which a retroreflective plate is formed between an TFT substrate having thin film transistors and an organic layer in JP 2002-198184A and JP 2007-165331A. The retroreflective plate is formed of a corner cube array, and units of the retroreflective plate are arranged at predetermined intervals in accordance with the largeness of the view field of the observer.

SUMMARY OF THE INVENTION

In the organic electroluminescence display device of the prior art, since the retroreflective plate is formed throughout a plurality of pixels, it is difficult to form a contact hole or a bank structure pixel by pixel. Therefore, it has been difficult to apply such a retroreflective plate to the organic electroluminescence display device having a number of organic electroluminescence elements.

The present invention is made taking such a circumstance into consideration, and has an object of realizing an increase in luminance and an improvement in visibility of the organic electroluminescence display device due to the application of the retroreflective plate.

(1) An organic electroluminescence display device according to the invention includes a retroreflective body formed so as to correspond to each of pixels, a plurality of organic electroluminescence elements formed on the retroreflective bodies so as to correspond to the pixels, and a pixel separation film adapted to section the pixels, and the pixel separation film is formed in an area corresponding to an area between a boundary between the pixels adjacent to each other and an outer periphery of the retroreflective body.

(2) In the organic electroluminescence display device according to the invention as in (1), it is possible that the retroreflective body is formed of a plurality of retroreflective structures, each having an equilateral-triangular planar shape, and adjacent to each other.

(3) In the organic electroluminescence display device according to the invention as in (2), it is possible that the retroreflective body is constituted by a plurality of the retroreflective structures different in planar size from each other.

(4) In the organic electroluminescence display device according to the invention described in any one of (1) through (3), it is possible that there are further included a thin film transistor formed below the retroreflective body so as to correspond to each of the pixels, and a contact hole adapted to connect the thin film transistor and the organic electroluminescence element to each other and formed so as to correspond to each of the pixels, and the contact hole is formed inside the pixel separation film in a planar view.

(5) In the organic electroluminescence display device according to the invention as in (4), it is possible that the pixel separation film includes pedestal base sections, each of which is a part projecting from the boundary toward a center of the pixel in the planar view, so as to correspond respectively to the pixels, the contact hole is located in the pedestal base section in the planar view, and two or more of the contact holes are arranged so as to be adjacent to each other across the boundary in the planar view to thereby form a pedestal section having a plurality of the pedestal base sections adjacent to each other across the boundary.

(6) In the organic electroluminescence display device according to the invention described in any one of (1) through (5), it is possible that a plurality of pixel sets, each formed of a plurality of pixels different in planar shape from each other, is formed.

(7) In the organic electroluminescence display device according to the invention described in any one of (1) through (6), it is possible that the retroreflective body has a hexagonal planar shape.

(8) In the organic electroluminescence display device according to the invention described in any one of (1) through (7), it is possible that the retroreflective body is formed using a nanoimprint process.

BRIEF DESCRIPTION OF THE DRAWINGS

FIG. 7 is a partial enlarged view showing a modified example of an arrangement example of the retroreflective bodies shown in FIG. 3 and a color filter substrate in substantially the same view field as in FIG. 6.

FIG. 16 is a partial enlarged view showing an arrangement example of pixels in substantially the same view field as in FIG. 3.

DETAILED DESCRIPTION OF THE INVENTION

An organic electroluminescence display device according to an embodiment of the invention will hereinafter be explained based on the accompanying drawings using an organic electroluminescence display device 1 as an example. It should be noted that the drawings referred to in the following explanation show a characteristic part in an enlarged manner for the sake of convenience of easier understanding of the characteristics in some cases, and the dimensional ratios between the constituents, for example, are not necessarily the same as actual ones. Further, the materials and so on shown as an example in the following explanation are illustrative only, the constituents can also have different ones, and implementation is possible while being modified within the scope or the spirit of the invention.

Figure 1:
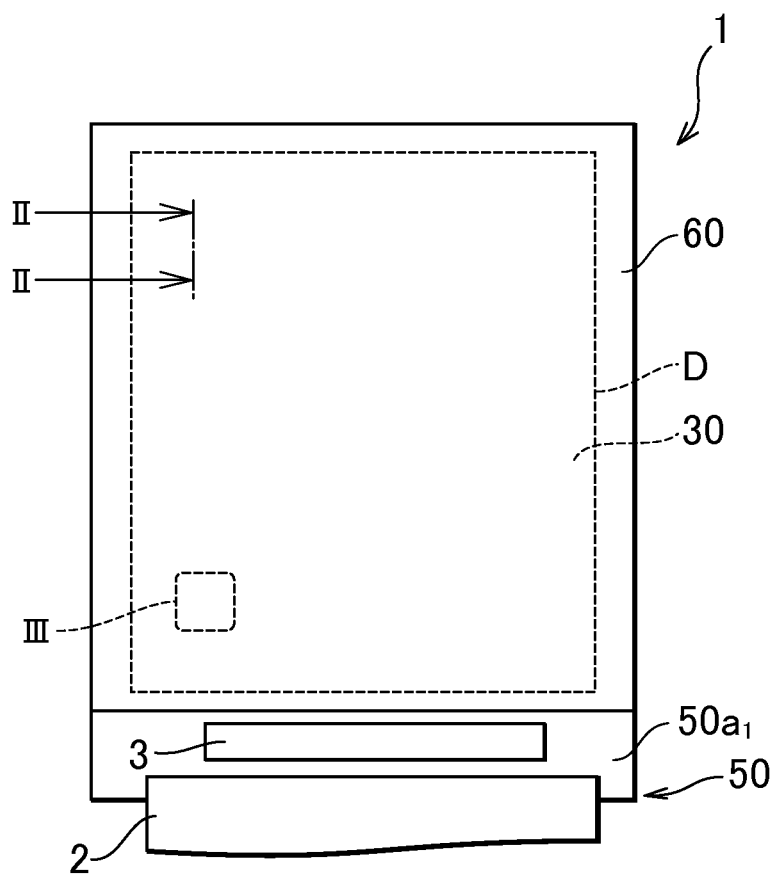
FIG. 1 is a schematic plan view of an organic electroluminescence display device according to an embodiment of the invention.

FIG. 1 is a schematic plan view of the organic electroluminescence display device 1. The organic electroluminescence display device 1 has a TFT substrate (a thin film transistor substrate) 50, and an opposed substrate 60 disposed so as to be opposed to a part of the thin film transistor substrate 50. In a region $50a_1$ on an upper surface $50a$ of the thin film transistor substrate 50 where the opposed substrate 60 is not disposed, a flexible circuit board 2 is connected, and further, a driver integrated circuit (IC) 3 is disposed.

The driver IC 3 is an IC disposed on the thin film transistor substrate 50, and is supplied with image data from the outside of the organic electroluminescence display device 1 via the flexible circuit board 2. The driver IC 3 is supplied with the image data, and then, supplies an organic electroluminescence element 30 described later with voltage signals to be applied to respective pixels via data lines not shown.

Figure 2:
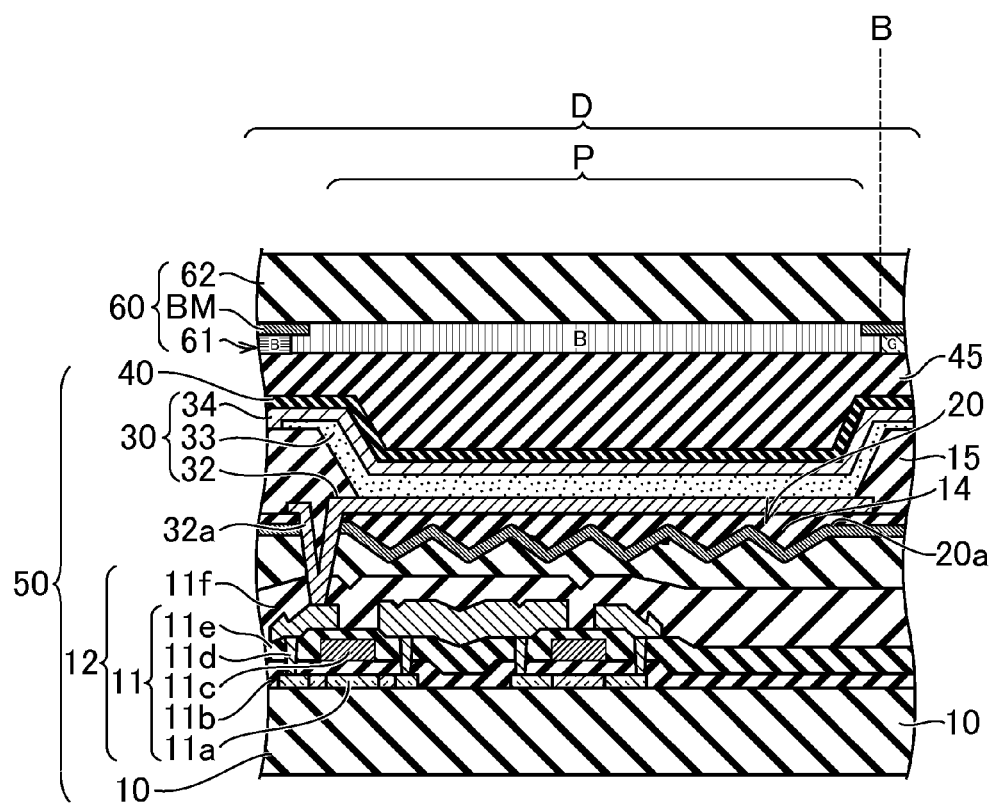
FIG. 2 is a schematic cross-sectional view in the II-II section line of the organic electroluminescence display device shown in FIG. 1.

Then, a configuration of a display area D of the organic electroluminescence display device 1 will be explained in detail. FIG. 2 is a schematic cross-sectional view in the II-II section line of the organic electroluminescence display device 1 shown in FIG. 1.

The display area D is an area in which the electroluminescence element 30 is formed, and an image is displayed. In the thin film transistor substrate 50 in the display area D, there are formed in sequence an insulating substrate 10, a circuit layer 12 having thin film transistors 11 and formed on the insulating substrate 10, a planarization film 13, a retroreflective body 20, a transparent optical layer 14, a pixel separation film 15, the organic electroluminescence element 30, and a sealing film 40 for covering the organic electroluminescence element 30 throughout the entire display area D.

The insulating substrate 10 is a substrate made of an insulating material, and has an upper surface on which the circuit layer 12 is formed. The circuit layer 12 is a layer in which the thin film transistors 11, a passivation film 11$f$, and electric wiring not shown, and so on are formed, and is formed for driving the organic electroluminescence element 30.

The thin film transistors 11 are disposed on the substrate 10 made of an insulating material corresponding respectively to the pixels P, and are each formed of specifically, for example, a polysilicon semiconductor layer 11$a$, a first insulating film 11$b$, a gate electrode 11$c$, source/drain electrodes 11$d$, and a second insulating film 11$e$. Further, an upper surface of the thin film transistor 11 is covered with the passivation film 11$f$. The thin film transistor 11 is formed below the retroreflective body 20 described later so as to correspond respectively to the pixels P.

The planarization film 13 is formed so as to cover an upper surface of the circuit layer 12. The planarization film 13 is a layer made of an insulating material, and is formed between the insulating substrate 10 and the organic electroluminescence element 30 to thereby electrically insulate the thin film transistors 11 adjacent to each other, and the thin film transistor 11 and the organic electroluminescence element 30 from each other.

The planarization film 13 can also be formed of, for example, a material having an insulation property such as acryl, polyimide, or epoxy, a thermoplastic material, or a fluorinated material. Further, the planarization film 13 is provided with a contact hole 32$a$ for electrically connecting the thin film transistor 11 in the thin film transistor substrate 50 and the organic electroluminescence element 30 to each other so as to correspond to each of the pixels P.

In an area corresponding to each of the pixels P on the planarization film 13, there is formed the retroreflective body 20 so as to correspond to each of the pixels P. The retroreflective body 20 is formed in order to reflect the light, which is input from the opposed substrate 60 side, such as the light emitted from the organic electroluminescence element 30 and outside light from the outside of the display device 1, toward the incident direction. The retroreflective body 20 is preferably formed of a material high in optical reflectance, and is formed of, for example, aluminum or silver (Ag). It should be noted that the detailed configuration of the retroreflective body 20 will be described later for the sake of convenience of explanation.

An upper surface of the retroreflective body 20 is covered with a transparent optical layer 14. The transparent optical layer 14 is a layer to be provided with the organic electroluminescence element 30 formed thereon, and is formed to planarize the upper surface of the retroreflective body 20. The transparent optical layer 14 is formed of a material having an insulation property such as $SiO_2$, SiN, acryl, or polyimide, or an insulating material having a laminate structure of these materials and a light transmissive property.

In the case of using an inorganic material, it is also possible to use chemical mechanical polishing (CMP) for planarization.

There is formed the plurality of organic electroluminescence elements 30 corresponding respectively to the pixels P over the retroreflective body 20 via the transparent optical layer 14. The organic electroluminescence element 30 has a lower electrode (an anode in the present embodiment) 32, an organic layer 33 having at least a light emitting layer, and an upper electrode (a cathode in the present embodiment) 34 formed so as to cover an upper surface of the organic layer 33, and thus, functions as a light emitting source.

The anode 32 is an electrode for injecting a drive current into the organic layer 33. The anode 32 is connected to the contact hole 32a, and is therefore electrically connected to the thin film transistor 11, and is supplied with the drive current from the thin film transistor 11.

The anode 32 is formed of a material having electrical conductivity. Although it is preferable that the material of the anode 32 is specifically, for example, indium tin oxide (ITO), the material of the anode 32 can also be a material having a light transmissive property and electrical conductivity such as indium-zinc complex oxide, tin oxide, zinc oxide, indium oxide, or aluminum complex oxide.

Between the anodes 32 adjacent to each other, the pixel separation film 15 for sectioning the pixel P is formed along the boundary B between the pixels P adjacent to each other. The pixel separation film 15 is formed in an area corresponding to an area between the boundary B between the pixels P adjacent to each other and the outer periphery 20a of the retroreflective body 20. The pixel separation film 15 has a function of preventing a contact between the anodes 32 adjacent to each other, a function of preventing a leakage current between the anode 32 and the cathode 34, and a function of sectioning the retroreflective bodies 20 into the pixels P. The pixel separation film 15 is made of an insulating material, and is specifically made of, for example, a photosensitive resin component. It should be noted that the detailed configuration of the pixel separation film 15 will be described later for the sake of convenience of explanation.

The organic layer 33 is a layer having at least a light emitting layer and formed of an organic material, and is formed to cover upper surfaces of the plurality of anodes 32 and an upper surface of the pixel separation film 15. Although the organic layer 33 in the present embodiment is formed so as to cover the entire surface of the area, in which the pixels P are disposed, out of the display area D, the area in which the organic layer 33 is formed is not limited to the example mentioned above, but the organic layer 33 can also be formed so as to correspond to each of the anodes 32. The organic layer 33 includes a layer for emitting light, and the light can be a white color, or other colors.

The organic layer 33 has a hole injection layer, a hole transport layer, a light emitting layer, an electron transport layer, and an electron injection layer (all not shown) stacked in sequence from the anode 32 side, for example. The laminate structure of the organic layer 33 is not limited to the structure cited here providing the laminate structure includes at least a light emitting layer.

The light emitting layer is formed of, for example, an organic electroluminescence material for emitting light due to the hole and the electron combined with each other. Such an organic electroluminescence material can be, for example, a material generally used as organic light emitting material.

The cathode 34 is formed so as to cover the upper surface of the organic layer 33. The cathode 34 is not separated into pixels P, and is formed so as to cover the entire surface of the area in which the pixels P are disposed out of the display area D. By providing such a configuration, the cathode 34 has commonly contact with the organic layer 33 of the plurality of organic electroluminescence elements 30.

The cathode 34 is formed of a material having a light transmissive property and electrical conductivity. It is preferable that the material of the cathode 34 is specifically, for example, ITO, but there can also be adopted a material obtained by mixing metal such as silver or magnesium in an electrically conductive metal oxide such as ITO or InZnO, or a material obtained by stacking a metal thin film made of, for example, silver or magnesium, and an electrically conductive oxide on each other.

An upper surface 34a of the cathode 34, which is an upper surface of the organic electroluminescence element 30 is covered with the sealing film 40 throughout the entire display area D. The sealing film 40 is a transparent film for preventing infiltration of oxygen and moisture into the layers such as the organic layer 33. The sealing film 40 can be formed of a plurality of films made of an inorganic material and an organic material.

An upper surface of the sealing film 40 is covered with the opposed substrate 60 via, for example, a filler 45. The opposed substrate 60 is, for example, a substrate having a circumference smaller than the substrate 10 in a planar view, and is disposed so as to face the substrate 10. As such an opposed substrate 60, a color filter substrate can specifically be used, for example, in the case in which the organic layer 33 is a layer for emitting white light.

In the case in which the opposed substrate 60 is a color filter substrate, the opposed substrate 60 includes, for example, a color filter 61, a black matrix BM, and a transparent substrate 62. The color filter 61 is a filter for transmitting light in a predetermined wavelength region in an area opposed to each of the pixels P. The color filter 61 is sectioned into, for example, regions R, regions BL, and regions G so as to correspond respectively to the pixels P using a black matrix BM formed along the boundary B. It should be noted that the opposed substrate 60 is not limited to the color filter substrate, but can also be other substrates.

Figure 3:
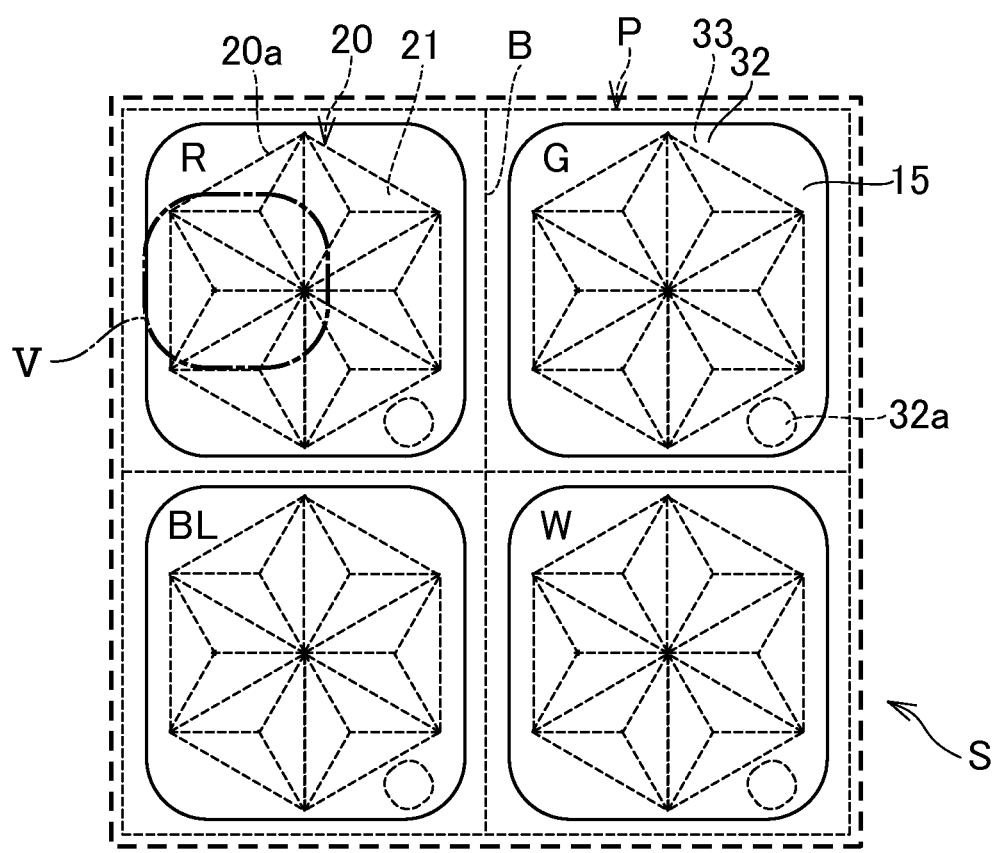
FIG. 3 is a partial enlarged view of the III region of the organic electroluminescence display device shown in FIG. 1.

Then, the detailed configuration of the retroreflective body and the pixel separation film 15 in the periphery of the retroreflective body 20 will be explained. FIG. 3 is a partial enlarged view of the III region of the organic electroluminescence display device 1 shown in FIG. 1. It should be noted that the description of the cathode 34, the sealing film 40, the filler 45, and the opposed substrate 60 will be omitted for the sake of convenience of explanation.

It should be noted that in the present embodiment, as shown in FIG. 3, a combination formed of a plurality of pixels P adjacent to each other is denoted as a pixel set S. The pixel set S is a unit of the combination of the pixels P in which, for example, the pixels P emitting light different in wavelength region from each other are combined with each other. In the present embodiment, a plurality of pixel sets S is arranged contiguously in the display area D.

The pixel set S is specifically formed of, for example, the region R for emitting red light, the region G for emitting green light, the region BL for emitting blue light, and the region W for emitting white light as shown in FIG. 3. It should be noted that the configuration of the pixel set S shown in FIG. 3 is illustrative only, and any other configurations having a combination formed of two or more pixels P adjacent to each other can also be adopted.

As shown in FIG. 3, the retroreflective body 20 is formed of a plurality of retroreflective structures 21, each having an equilateral-triangular planar shape, adjacent to each other. It should be noted that the "equilateral triangle" in the present embodiment includes not only an equilateral-triangular shape but also shapes shifted from the equilateral-triangular shape within the margin of error due to a manufacturing process. In FIG. 3, there is shown an example of constituting the retroreflective body 20 having a hexagonal planar shape with the six retroreflective structures 21 adjacent to each other.

Further, the pixel separation film 15 is formed so as to cover the anode 32 in the area corresponding to the area between the boundary B between the pixels P adjacent to each other and the outer periphery 20a of the retroreflective body 20. By providing such a configuration, the anode 32 is exposed from the pixel separation film 15 in an area corresponding to an area in which the retroreflective body 20 is formed.

The organic electroluminescence display device 1 in the present embodiment is provided with the pixel separation film 15 formed in the area corresponding to the area between the boundary B between the pixels P adjacent to each other and the outer periphery 20a of the retroreflective body 20, and therefore, the retroreflective bodies 20 are sectioned into the pixels P.

Therefore, it is possible to apply the retroreflective bodies 20 having the retroreflective structures 21 even to the organic electroluminescence display device 1 having a plurality of organic electroluminescence elements 30 sectioned into pixels P. Thus, the light emitted from the organic electroluminescence element 30 toward the thin film transistor substrate 50 is reflected by the retroreflective bodies 20 toward the opposed substrate 60, and an increase in luminance and an improvement in image quality of the organic electroluminescence display device 1 can be realized.

Further, by providing the retroreflective bodies 20 to the organic electroluminescence display device 1 according to the present embodiment, the outside light input from the outside of the opposed substrate 60 is also reflected toward the input side thereof. Therefore, the background reflections of the outside light to the organic electroluminescence display device 1 can be prevented, and thus, an improvement in image quality can be realized.

Further, it is preferable that the contact hole 32a is formed so as to be located inside the pixel separation film 15 in a planar view as shown in FIG. 3. Specifically, the contact hole 32a is formed in the area between the boundary B between the pixels P and the outer periphery 20a of the retroreflective body 20 in a planar view, and the upside thereof is covered with the pixel separation film 15.

Figure 4:
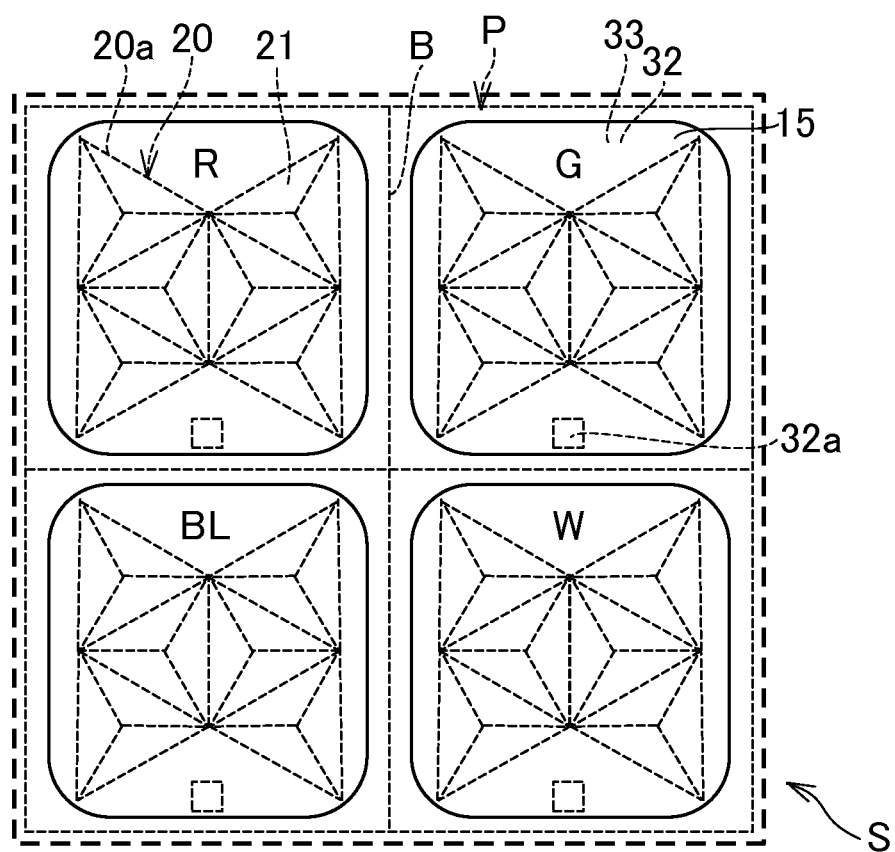
FIG. 4 is a partial enlarged view showing a modified example of the organic electroluminescence display device shown in FIG. 1 in substantially the same view field as in FIG. 3.

FIG. 4 is a partial enlarged view showing a modified example of the organic electroluminescence display device 1 shown in FIG. 1 in substantially the same view field as in FIG. 3. As shown in FIG. 4, it is not required for the planar shape of the retroreflective body 20 to be a regular hexagonal shape. In FIG. 4, there is shown an example of forming the retroreflective body 20 having a hexagonal planar shape with the six retroreflective structures 21. The contact hole 32a in FIG. 4 is formed at a place where the distance between the boundary B between the pixels P and the outer periphery 20a of the retroreflective body 20 is the longest. The place where the contact hole 32a is formed can arbitrarily be selected in accordance with the planar shape of the retroreflective body 20 in such a manner.

In the organic electroluminescence display device 1 according to the present embodiment, since the pixel separation film 15 is formed in the area corresponding to the area between the boundary B and the outer periphery 20a of the retroreflective body 20 as described above, the contact hole 32a can be disposed in this area. Therefore, even in the organic electroluminescence display device 1 having the retroreflective bodies 20, it becomes possible to install the contact hole 32a in each of the pixels P.

Further, since the contact hole 32a is formed inside the pixel separation film 15 in a planar view, there is no need to additionally prepare the area for forming the contact hole 32a compared to an organic electroluminescence display device not provided with the present configuration. Therefore, it is possible to prevent the degradation of the luminance of the organic electroluminescence display device 1.

Figure 5:
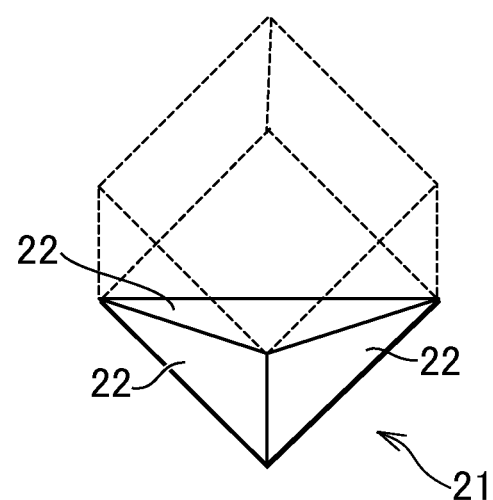
FIG. 5 is a partial perspective view for explaining a detailed structure of a retroreflective structure shown in FIG. 3.

FIG. 5 is a partial perspective view for explaining a detailed structure of the retroreflective structure 21 shown in FIG. 3. The retroreflective structure 21 in the present embodiment has, for example, a trigonal pyramid shape formed of three metal films 22 each having a rectangular equilateral triangular shape. Specifically, the retroreflective structure 21 has a shape of a trigonal pyramid having rectangular equilateral triangular surfaces taken from the three surfaces adjacent to each other among the six surfaces of a regular hexahedron. By providing such a configuration, the planar shape of the retroreflective structure 21 becomes an equilateral triangular shape.

It should be noted that the retroreflective body 20 and the retroreflective structure 21 are formed using a nanoimprint process. Even in the retroreflective bodies 20 and the retroreflective structures 21 having the fine configuration, the resistance caused when peeling off a nano stamper from the transparent optical layer 14 in the formation process can be suppressed using the nanoimprint process. Therefore, compared to the retroreflective structures formed using other methods, the retroreflective structures 21 having a trigonal pyramid shape provided with fine rectangular equilateral triangular surfaces can be obtained.

Therefore, the retroreflective structures 21 high in reflectance compared to the organic electroluminescence display device not provided with the present configuration are formed in accordance with the pixel P, and thus, an increase in resolution, an increase in luminance, and an improvement in visibility of the organic electroluminescence display device 1 can be realized.

Further, in the organic electroluminescence display device according to the present embodiment, by providing the retroreflective structure 21 with such a configuration, the light emitted from the organic electroluminescence element 30 and the outside light input from the outside of the opposed substrate 60 can be reflected outside the opposed substrate 60 with high efficiency compared to the organic electroluminescence display device not provided with the present configuration. Therefore, an increase in luminance and an improvement in image quality of the organic electroluminescence display device 1 can be realized.

Further, since the planar shape of the retroreflective structure 21 is an equilateral-triangular shape, by arranging the plurality of retroreflective structures 21 adjacent to each other, the retroreflective body 20 corresponding to the planar shape of the pixel P can be formed. Therefore, compared to the organic electroluminescence display device not provided with the present configuration, the proportion of the area in which the retroreflective body 20 is formed in the pixel P can be increased, and thus, the organic electroluminescence display device 1 high in luminance, high in resolution, and high in image quality can be realized.

Figure 6:
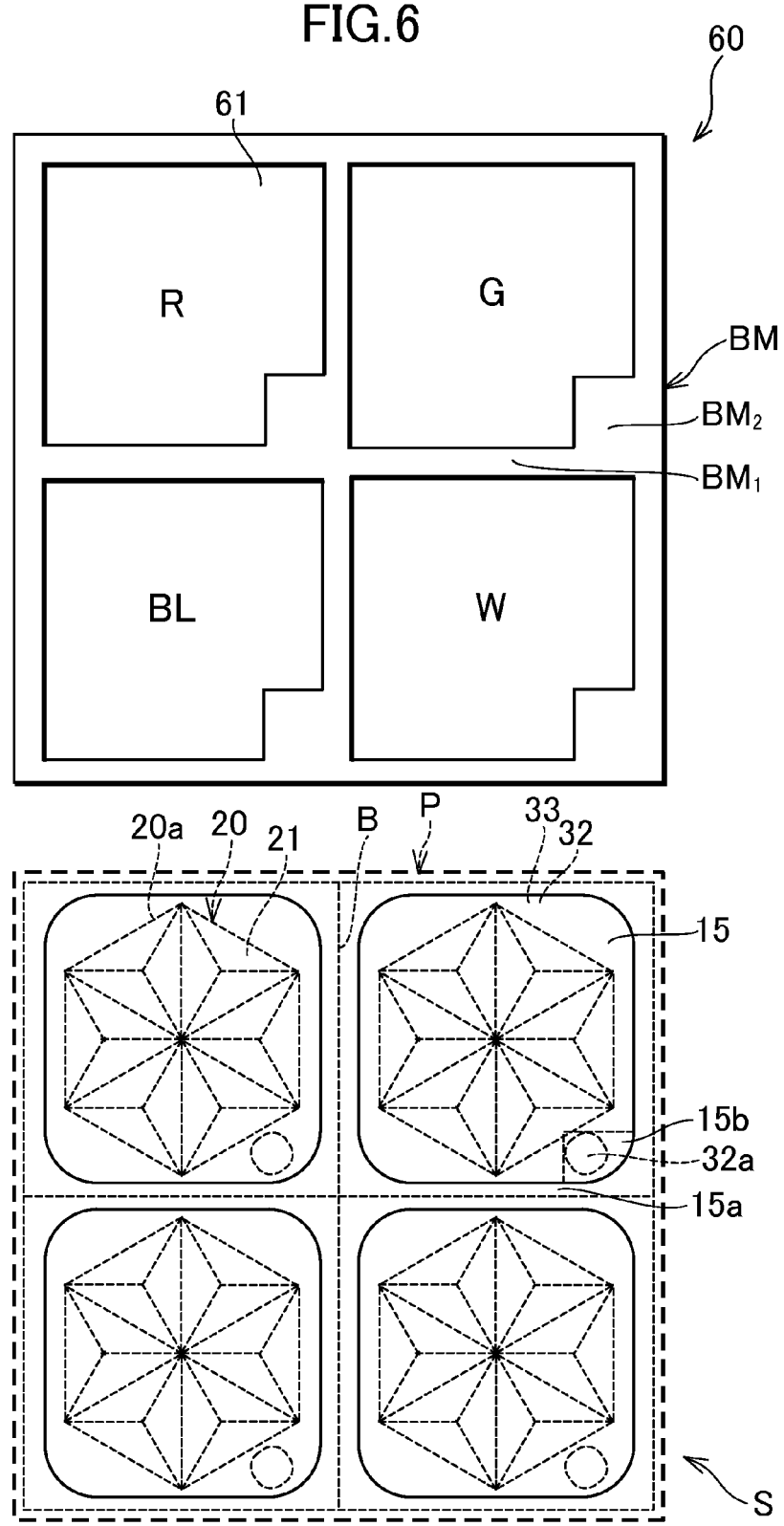
FIG. 6 is a partial enlarged view showing an arrangement example of the retroreflective bodies shown in FIG. 3 and a color filter substrate.

Then, the configuration of the opposed substrate 60 as the color filter substrate will be explained in accordance with the position of the contact hole 32a. FIG. 6 is a partial enlarged view showing an arrangement example of the retroreflective bodies 20 shown in FIG. 3 and the color filter substrate (the opposed substrate) 60.

As shown in FIG. 6, the pixel separation film 15 has a pixel sectioning section 15a and pedestal base sections 15b. The pixel sectioning section 15a is apart formed along the boundary B between the pixels P and for sectioning the anodes 32 into the pixels P. Since the pixel P in the present embodiment has a roughly rectangular planar shape, the pixel sectioning section 15a has a grid-like planar shape.

The pedestal base section 15b is a part projecting from the boundary B between the pixels P toward the center of the pixel P in a planar view. The pedestal base section 15b is formed so as to overlap the upside of the contact hole 32a in the planar view.

The opposed substrate 60 is sectioned by the black matrix BM so that, for example, the regions R, the regions BL, the regions G, and the regions W correspond respectively to the pixels P. The black matrix BM includes a black matrix sectioning section $BM_1$ formed in an area corresponding to the pixel sectioning section 15a, and black matrix base sections $BM_2$ each of which projects from the boundary B between the pixels P toward the center of the pixel P in the planar view, and corresponds to the pedestal base section 15b.

The black matrix base sections $BM_2$ are formed so as to respectively overlap the pedestal base sections 15b in the planar view. Therefore, in the area corresponding to the contact hole 32a, there are disposed the pedestal base section 15b of the pixel separation film 15 and the black matrix base section $BM_2$ so as to overlap each other in the planar view.

FIG. 7 is a partial enlarged view showing a modified example of an arrangement example of the retroreflective bodies 20 shown in FIG. 3 and the color filter substrate (the opposed substrate) 60 in substantially the same view field as in FIG. 6. In FIG. 7, two or more contact holes 32a are arranged adjacent to each other across the boundary B between the pixels P in the planar view.

By arranging the contact holes 32a in such a manner, the plurality of pedestal base sections 15b of the pixel separation film 15 is adjacent to each other across the boundary B. Therefore, the plurality of pedestal base sections 15b is adjacent to each other across the pixel sectioning section 15a, and a pedestal section 15c including a region $15a_1$ of the pixel sectioning section 15a located between the plurality of pedestal base sections 15b and the pedestal base sections 15b is formed for each of the pixels sets S.

The pedestal section 15c is a region where a spacer SP is disposed. The spacer SP is formed of, for example, a photosensitive photoresist, and is disposed for keeping the distance between the organic electroluminescence element 30 and the opposed substrate 60 constant. It should be noted that the spacer SP is not required to be disposed to each of all of the pixel sets S, and it is sufficient to dispose the spacers SP as much as the distance between the opposed substrate 60 and the organic electroluminescence element 30 can stably be kept.

Further, in the case in which the contact holes 32a are arranged in such a manner as described above, it is preferable to form a black matrix pedestal section $BM_3$ at the position overlapping the contact holes 32a and the pedestal section 15c in the planar view. Specifically, by arranging the black matrix base sections $BM_2$ so as to overlap the pedestal base sections 15b of the pixel separation film 15 in the planar view, the plurality of black matrix base sections $BM_2$ is adjacent to each other across the black matrix sectioning section $BM_1$.

Thus, the black matrix pedestal section $BM_3$ including the region of the black matrix sectioning section $BM_1$ located between the plurality of black matrix base sections $BM_2$ and the black matrix base sections $BM_2$ is formed so as to overlap the pedestal section 15c of the pixel separation film 15 in the planar view. The black matrix pedestal section $BM_3$ is a region having contact with an upper surface of the spacer SP.

By providing such a configuration, the spacer SP is disposed between the pedestal section 15c of the pixel separation film 15 and the black matrix pedestal section $BM_3$, and the distance between the organic electroluminescence element 30 and the opposed substrate 60 is kept constant.

In the organic electroluminescence display device 1 according to the present embodiment, since the two or more contact holes 32a are arranged so as to be adjacent to each other across the boundary B between the pixels P in the planar view, the pedestal section 15c large in area is formed without decreasing the area where the retroreflective body 20 is formed compared to the organic electroluminescence display device not provided with the present configuration.

Therefore, compared to the electroluminescence display device not provided with the present configuration, even if the fine pixels P are provided, the pedestal sections 15c can be prepared on the pixel separation film 15 as the areas on which the spacers SP are mounted so as to correspond to the respective pixel sets S without decreasing the areas of the retroreflective bodies 20. Thus, an increase in luminance and miniaturization of the pixels P can be realized.

Figure 8:
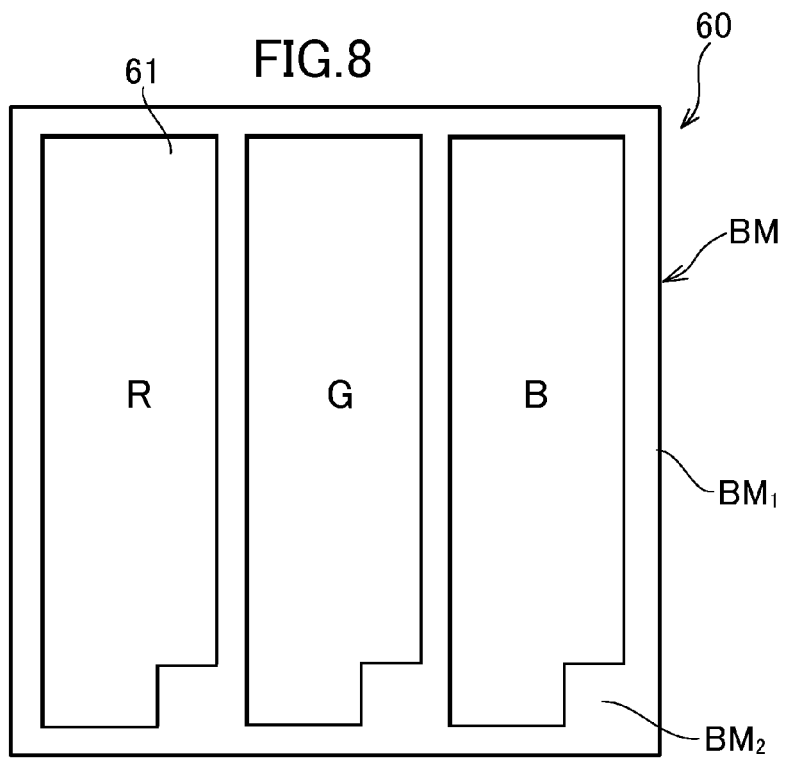
FIG. 8 is a partial enlarged view showing a modified example of an arrangement example of the retroreflective bodies shown in FIG. 3 and a color filter substrate in substantially the same view field as in FIG. 6.

FIG. 8 is a partial enlarged view showing a modified example of an arrangement example of the retroreflective bodies 20 shown in FIG. 3 and the color filter substrate (the opposed substrate) 60 in substantially the same view field as in FIG. 6. As described above, the planar shape of the pixel P is not limited to a roughly square shape, but can also be a roughly rectangular shape. In this case, it is sufficient to constitute the retroreflective bodies 20 corresponding to the shape of the pixels P by arbitrarily changing the number of the retroreflective structures 21. In FIG. 7, for example, the retroreflective bodies 20 each formed of 22 retroreflective structures 21 are disposed in each of the pixels P.

Further, the contact hole 32a is formed at a place where the distance between the boundary B between the pixels P and the outer periphery 20a of the retroreflective body 20 is the longest, and the pedestal base section 15b is disposed so as to overlap the contact hole 32a in the planar view.

The opposed substrate 60 shown in FIG. 8 is sectioned by the black matrix BM into the region R, the region BL, and the region G each having a roughly rectangular shape, which is a planar shape corresponding to each of the pixels P. Further, in the region corresponding to the contact hole 32a, there is formed the black matrix base section $BM_2$ so as to overlap the upside of the contact hole 32a and the upside of the pedestal base section 15b in the planar view.

Figure 9:
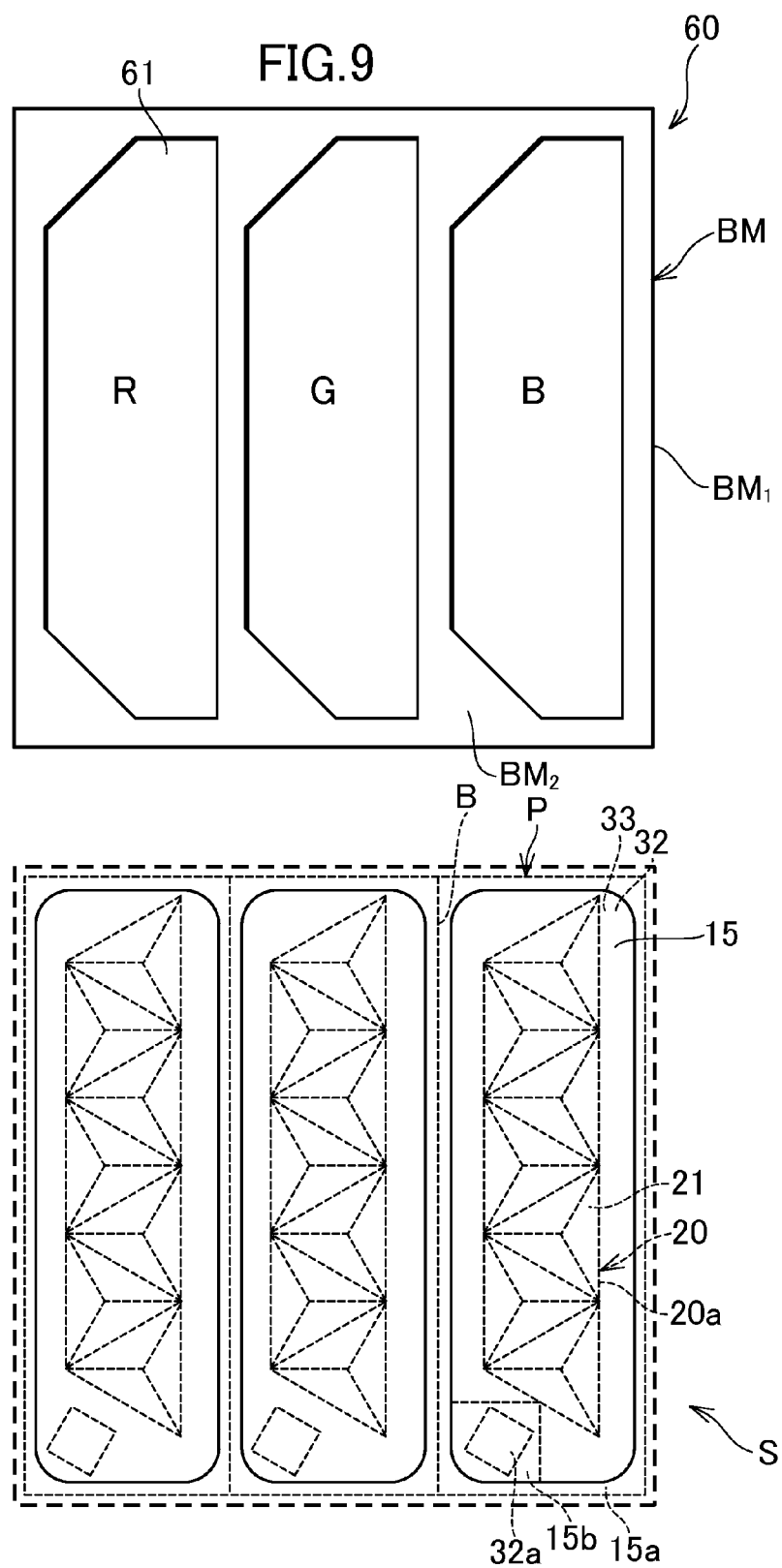
FIG. 9 is a partial enlarged view showing a modified example of an arrangement example of retroreflective bodies and a color filter substrate in substantially the same view field as in FIG. 6.

FIG. 9 is a partial enlarged view showing a modified example of an arrangement example of the retroreflective bodies 20 and the color filter substrate (the opposed substrate) 60 in substantially the same view field as in FIG. 6. The configuration of the retroreflective body 20 in the case in which the planar shape of the pixel P is a roughly rectangular shape is not limited to the configuration shown in FIG. 8, but the planar shape thereof can also be a roughly trapezoidal shape as shown in FIG. 9. In the example shown in FIG. 9, for example, the retroreflective bodies 20 each formed of 7 retroreflective structures 21 are disposed in each of the pixels P. Further, the planar shapes of the pedestal base section 15b and the black matrix base section $BM_2$ can also be roughly triangular as shown in FIG. 9.

Figure 10:
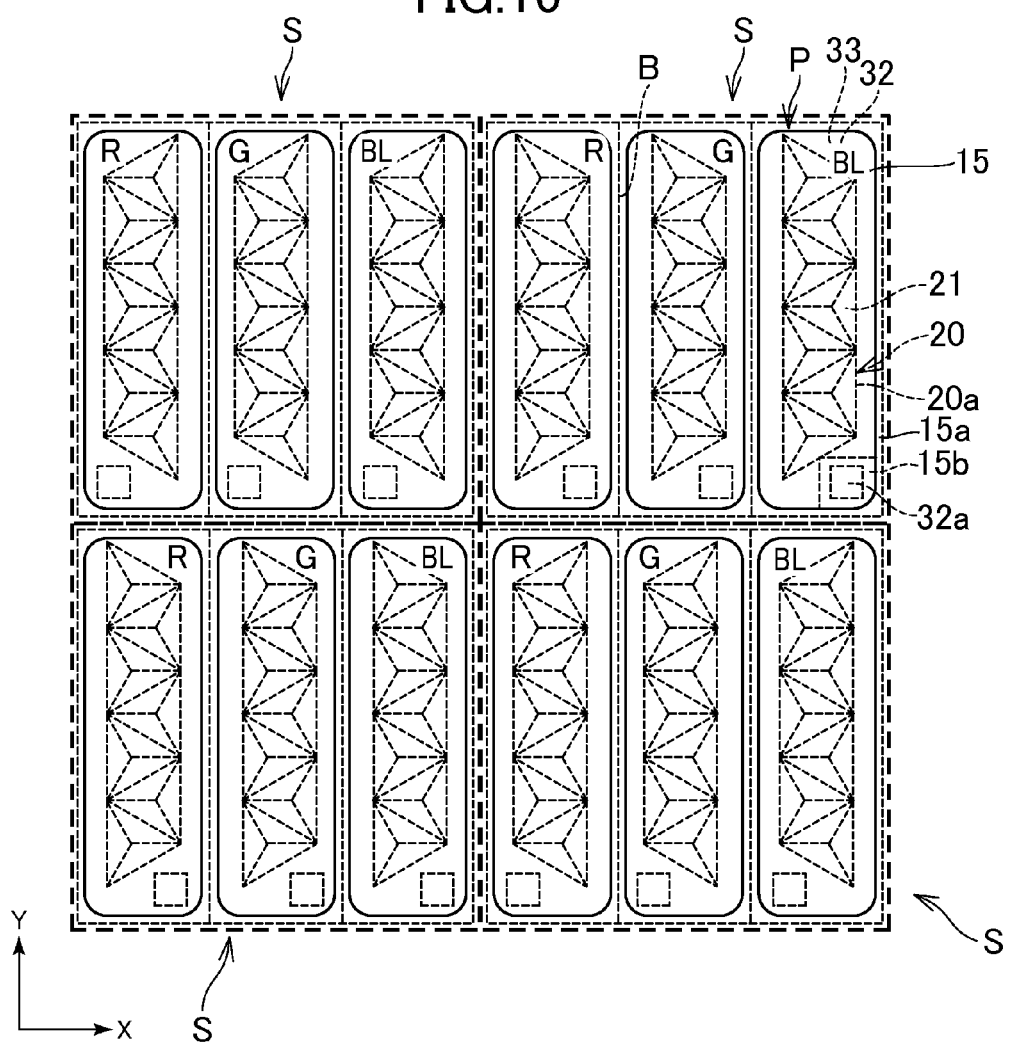
FIG. 10 is a partial enlarged view showing an arrangement example of retroreflective bodies in substantially the same view field as in FIG. 3.

FIG. 10 is a partial enlarged view showing an arrangement example of the retroreflective bodies 20 in substantially the same view field as in FIG. 3. In FIG. 10, an example of the configuration in the case in which the opposed substrate 60 is not the color filter substrate will be explained. Specifically, an arrangement of the pixels P and the configuration of the retroreflective bodies 20 will be explained using the configuration, in which the three types of organic layers 33 for emitting the light different in wavelength range from each other are formed in the respective pixels P, as an example. It should be noted that in FIG. 10, a configuration in which four pixel sets S each having three pixels P are arranged is shown for the sake of convenience of explanation.

The planar shape of the pixel P shown in FIG. 10 is a roughly rectangular shape similarly to FIG. 9, and the planar shape of the retroreflective body 20 formed in each of the pixels P is a roughly trapezoidal shape. It should be noted that the planar shapes of the pixel P and the retroreflective body 20 are illustrative only, and can also be other shapes.

As shown in FIG. 10, the organic layer 33 is provided with, for example, the regions R for emitting the red light, the regions G for emitting the green light, and the regions BL for emitting the blue light formed in the respective pixels P. These regions R, G, and BL are arranged so that the regions different from each other are adjacent to each other in the X direction shown in the drawing.

Further, although the orientation of the planar shape of the retroreflective body 20 shown in FIG. 10 is different between the retroreflective bodies 20 adjacent to each other in the Y direction, the orientation is not limited to the example shown in FIG. 10, but can arbitrarily be set in accordance with the forming place of the contact hole 32a and so on.

Figure 11:
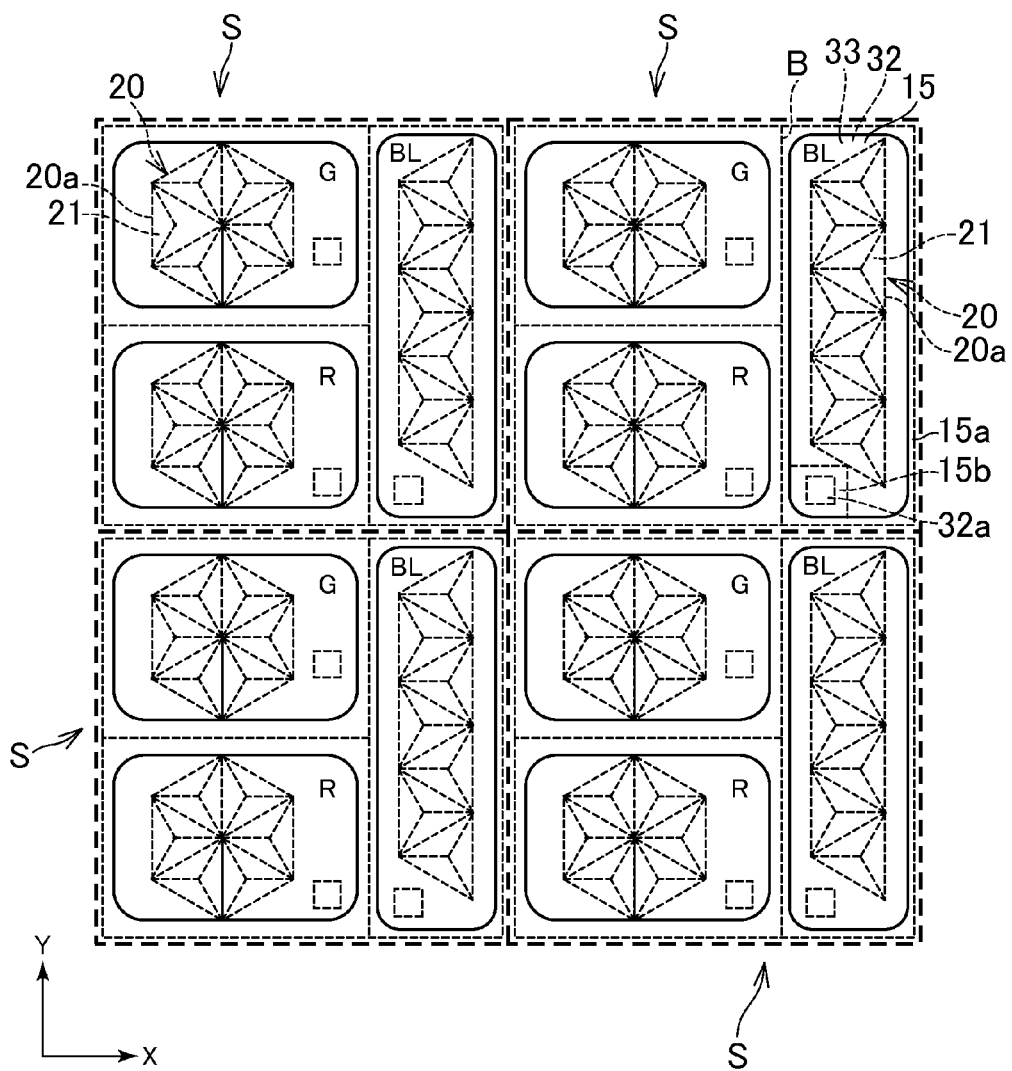
FIG. 11 is a partial enlarged view showing an arrangement example of retroreflective bodies in substantially the same view field as in FIG. 3.

Further, the planar shapes of the pixels P constituting the pixel set S are not limited to the same shapes as shown in FIG. 10. FIG. 11 is a partial enlarged view showing an arrangement example of the retroreflective bodies 20 in substantially the same view field as in FIG. 3. It should be noted that in FIG. 11, a configuration in which four pixel sets S each having three pixels P are arranged is shown for the sake of convenience of explanation.

The planar shape of the pixel P can also be different between the regions R, G, and BL of the organic layer 33. Specifically, in the organic electroluminescence display device 1 shown in FIG. 11, the planar shape of the region BL is a roughly rectangular shape, which is a shape higher in aspect ratio than the roughly rectangular shape provided to the planar shapes of the region G and the region R. Further, the planar shape of the retroreflective body 20 in the region BL is also a shape corresponding to the planar shape of the region, which is different from the planar shapes of the retroreflective bodies 20 in the region G and the region R.

Further, the number of the retroreflective structures 21 constituting the retroreflective body 20 in each of the pixels P can also be different between the pixels P. Specifically, as shown in FIG. 11, it is also possible to set the number of the retroreflective structures 21 constituting the retroreflective body 20 in the region BL to 7, and set the number of the retroreflective structures 21 in the region G and the region R to 6.

It should be noted that although in FIG. 11, there is explained the example having two types of planar shapes of the pixels P constituting the pixel set S and two types of planar shapes of the retroreflective bodies 20 provided to the respective pixels P, it is also possible to provide three or more types of planar shapes of the pixels P constituting the pixel set S. Further, the planar shapes of the pixels P and the retroreflective bodies 20 are not limited thereto, but can also be other shapes.

Figure 12:
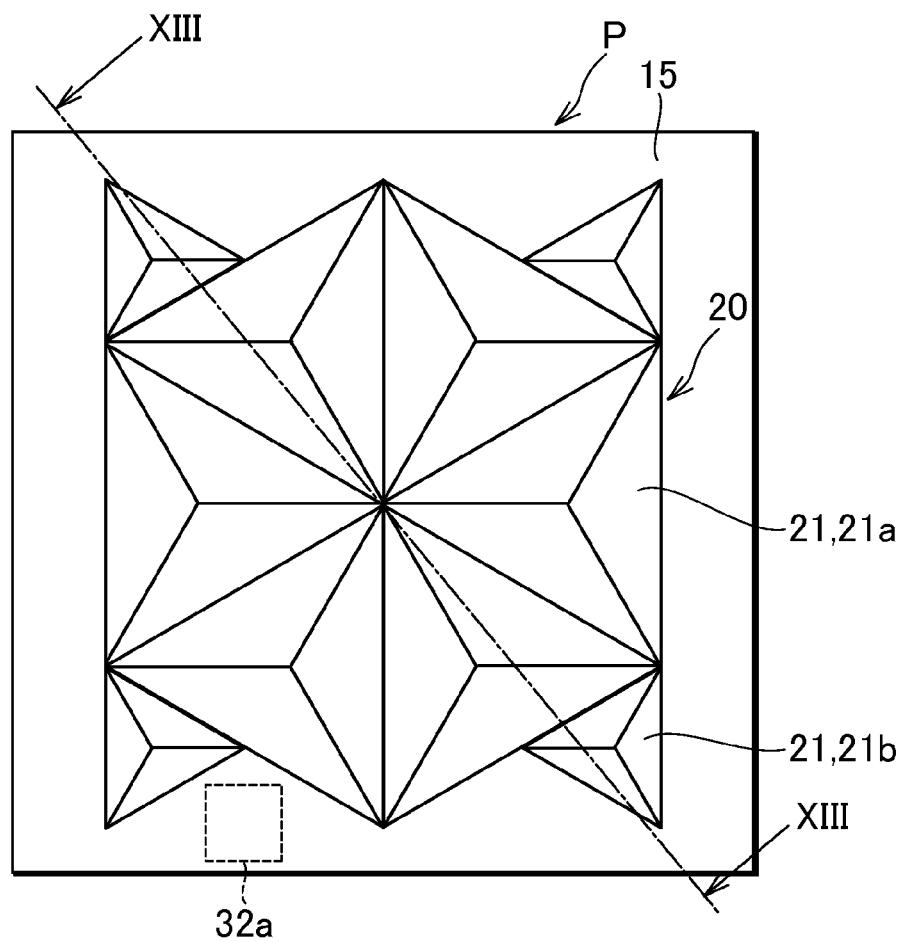
FIG. 12 is a partial enlarged view showing a modified example of a retroreflective body in substantially the same view field as in FIG. 3.
Figure 13:
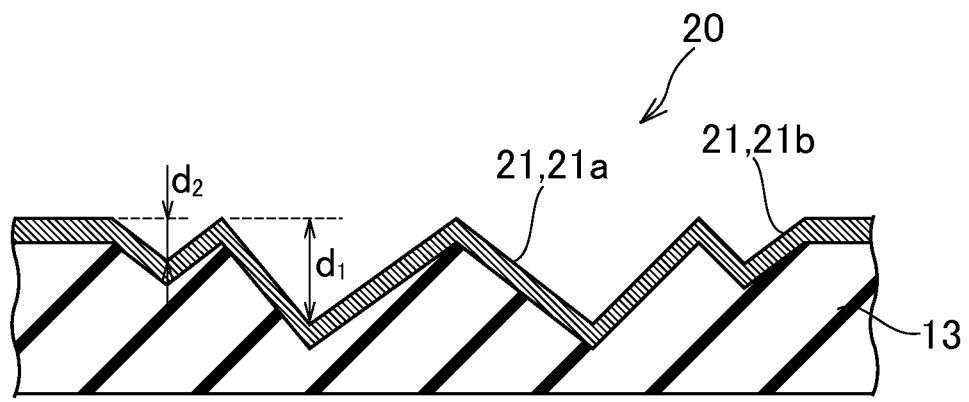
FIG. 13 is a schematic cross-sectional view in the XIII-XIII section line of the retroreflective body shown in FIG. 12.

FIG. 12 is a partial enlarged view showing a modified example of the retroreflective body 20 in substantially the same view field as in FIG. 3, and FIG. 13 is a schematic cross-sectional view in the XIII-XIII section line of the retroreflective body 20 shown in FIG. 12. In FIG. 12, the retroreflective body 20 is constituted by a plurality of retroreflective structures 21 different in planar size from each other. It should be noted that in FIGS. 12 and 13, one pixel P is shown alone, and the description of the organic layer 33 and the anode 32 will be omitted for the sake of convenience of explanation. Further, in FIG. 13, only the planarization film 13 and the retroreflective body 20 are shown for the sake of convenience of explanation.

The retroreflective body 20 is constituted by, for example, six first retroreflective structures 21a, and four second retroreflective structures 21b smaller in planar shape than the first retroreflective structure 21a. Here, "smaller in planar shape" denotes that the length of a side of the planar shape of the second retroreflective structure 21b is shorter than the length of a side of the first retroreflective structure 21a having an equilateral-triangular planar shape.

Further, since the retroreflective structure 21 has a triangular pyramid shape, the distance $d_1$ from the upper surface of the first retroreflective structure 21a to the upper surface 13a of the planarization film 13 becomes longer than the distance $d_2$ from the upper surface of the second retroreflective structure 21b to the upper surface 13a of the planarization film 13 as shown in FIG. 13.

Figure 14:
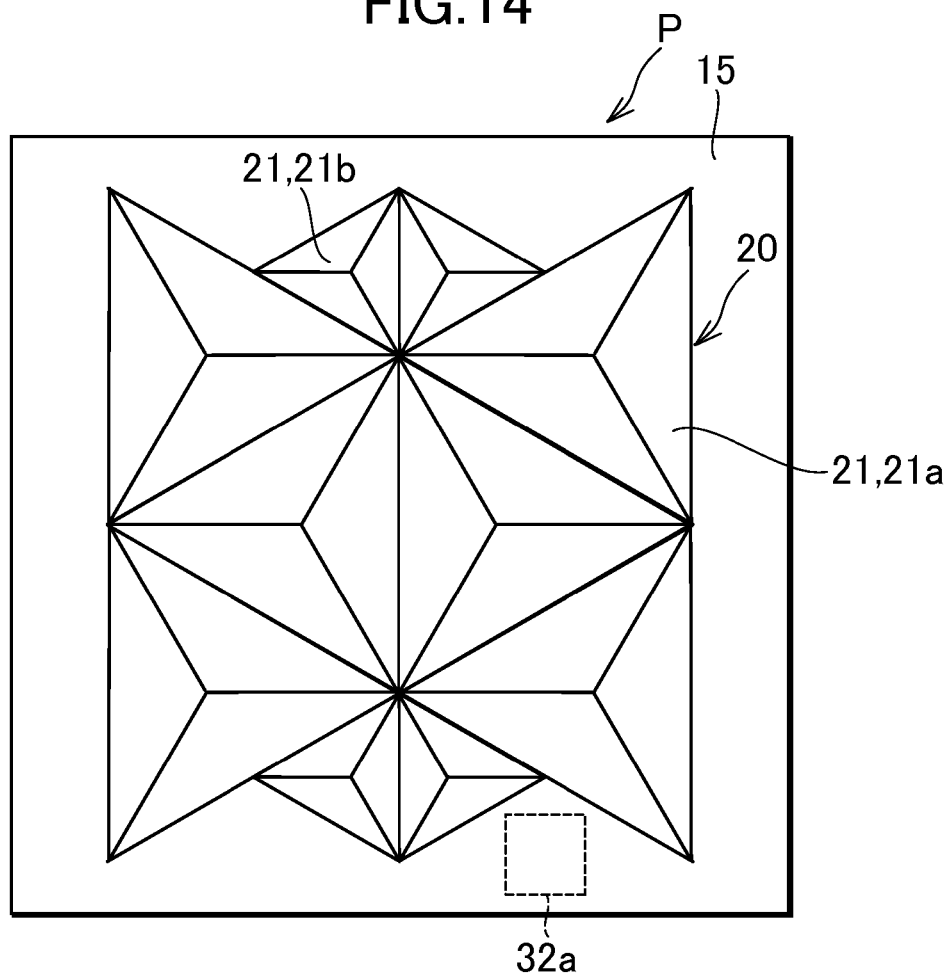
FIG. 14 is a partial enlarged view showing a modified example of a retroreflective body in substantially the same view field as in FIG. 3.

It should be noted that the configuration of the retroreflective body 20 formed of the plurality of retroreflective structures 21 different in planar size from each other is not limited to the configuration shown in FIG. 12, but can also be other configurations. FIG. 14 is a partial enlarged view showing a modified example of the retroreflective body 20 in substantially the same view field as in FIG. 3. It should be noted that in FIG. 14, descriptions of the organic layer 33 and the anode 32 will be omitted.

Although the retroreflective body 20 shown in FIG. 14 is also constituted by the six first retroreflective structures 21a and the four second retroreflective structures 21b similarly to the retroreflective body 20 shown in FIG. 12, the arrangement thereof is different from that of the retroreflective body 20 shown in FIG. 12.

Further, the number of the sizes of the planar shapes of the retroreflective structures 21 constituting the retroreflective body 20 is not limited to two, but three or more sizes can also be adopted. Further, the positions and arrangements of these retroreflective structures 21 different in size from each other are not limited to the examples cited in FIGS. 12 and 14, but can arbitrarily be selected in accordance with the shape and the size of the pixel P.

Since the organic electroluminescence display device 1 according to the present embodiment has the retroreflective bodies 20 each constituted by the plurality of retroreflective structures 21 different in planar size from each other as described above, the proportion of the area of the retroreflective body 20 in the pixel P in the planar view can be increased compared to the organic electroluminescence display device not provided with the present configuration.

Therefore, even in the organic electroluminescence display device 1 having the fine pixels P, a decrease in proportion of the area of the retroreflective body 20 in the pixel P can be suppressed, and an increase in resolution, an increase in luminance, and an improvement in visibility of the organic electroluminescence display device 1 can be realized.

Figure 15:
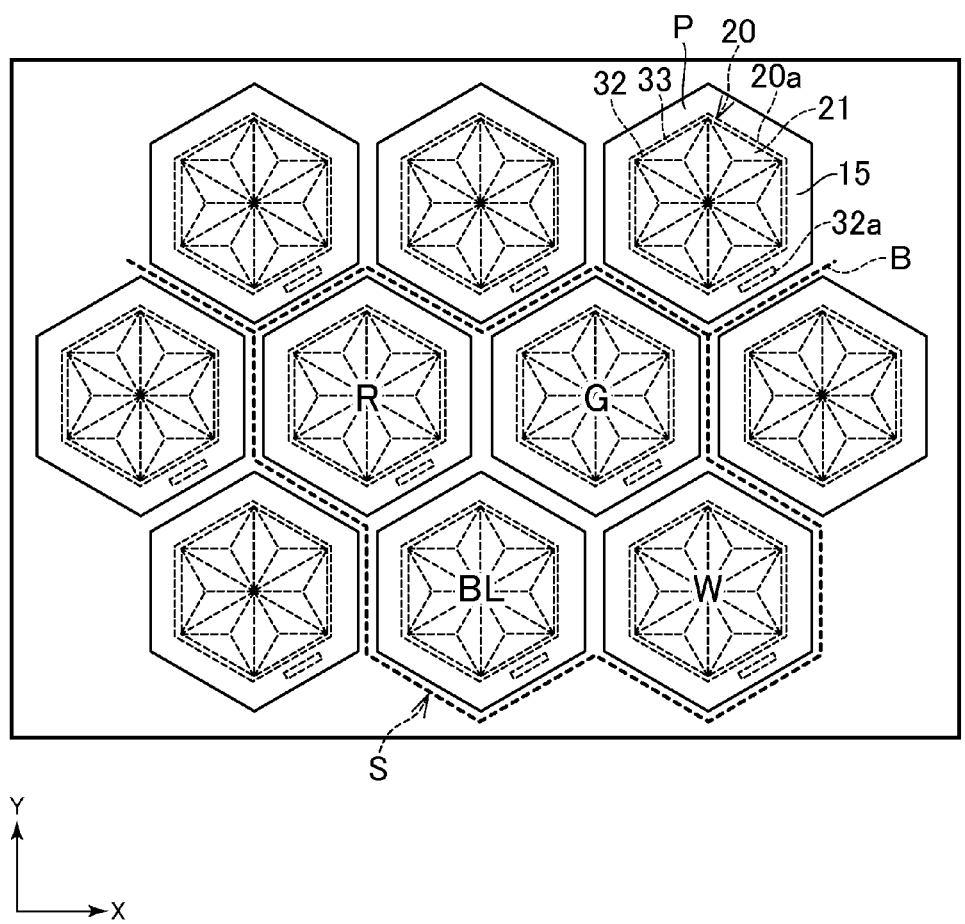
FIG. 15 is a partial enlarged view showing an arrangement example of pixels in substantially the same view field as in FIG. 3.

Then, a configuration of the organic electroluminescence display device 1 in the case of applying the pixels P having a planar shape other than a rectangular shape will be explained. FIG. 15 is a partial enlarged view showing an arrangement example of the pixels P in substantially the same view field as in FIG. 3.

The planar shape of the retroreflective body 20 shown in FIG. 15 is a hexagonal shape formed of the six retroreflective structures 21. Further, the pixels P each have a hexagonal planar shape similarly to the retroreflective body 20, and are arranged in a matrix so as to be adjacent to each other.

It is sufficient for the contact hole 32a to have the planar shape arbitrarily selected in accordance with the distance between the outer periphery 20a of the retroreflective body 20 and the boundary B between the pixels P. For example, the planar shape of the contact hole 32a in FIG. 15 is a roughly rectangular shape, and the contact hole 32a is formed along one side of the outer periphery 20a.

Since in the organic electroluminescence display device 1 according to the present embodiment, the retroreflective structure 21 has the equilateral-triangular planar shape, by arranging the six retroreflective structures 21 adjacent to each other, the retroreflective body 20 having a hexagonal planar shape is formed. Therefore, by arranging the pixels P each having a hexagonal planar shape in accordance with the retroreflective bodies 20, the proportion of the area of the retroreflective bodies 20 in the entire display area D can be increased compared to the organic electroluminescence display device not provided with the present configuration. Therefore, an increase in luminance, an increase in resolution, and an improvement in visibility of the organic electroluminescence display device 1 can be realized.

FIG. 16 is a partial enlarged view showing an arrangement example of the pixels P in substantially the same view field as in FIG. 3. In the example shown in FIG. 16, the planar shapes of the pixels P adjacent to each other in the pixel set S are different from each other. Further, the planar shapes of the retroreflective bodies 20 in the pixels P adjacent to each other are also different from each other. Specifically, the pixel set S shown in FIG. 16 includes, for example, two first pixels $P_1$ each having a regular hexagonal planar shape, and two second pixels $P_2$ each having a hexagonal shape having two vertexes with the vertex angle of 240°.

Further, a first retroreflective body 20b having a regular hexagonal planar shape is formed in the first pixel $P_1$, and a second retroreflective body 20c having a hexagonal shape having two vertexes with the vertex angle of 240° is formed in the second pixel $P_2$. It should be noted that in FIG. 16, there is shown an example provided with the pixels $P_1$ respectively having the regions R, G, and the pixels $P_2$ respectively having the regions BL, W.

Further, the plurality of first pixels $P_1$ or the plurality of second pixels $P_2$ is arranged to be adjacent to each other in the X direction, and the first pixel $P_1$ and the second pixel $P_2$ are arranged to be adjacent to each other in the Y direction. Thus, the first retroreflective body 20b and the second retroreflective body 20c are arranged to be adjacent to each other in the Y direction across the boundary B between the pixels P.

In the organic electroluminescence display device 1 according to the present embodiment, since the pixels P having the planar shape corresponding to the planar shape thereof are arranged to be adjacent to each other, even in the case in which the retroreflective bodies 20 (20b, 20c) having two or more types of planar shapes are formed, the proportion of the area of the retroreflective bodies 20 in the entire display area D can be increased compared to the organic electroluminescence display device not provided with the present configuration. Therefore, an increase in luminance, an increase in resolution, and an improvement in visibility of the organic electroluminescence display device 1 can be realized.

Although the embodiment of the invention is hereinabove explained, the invention is not limited to the embodiment described above. For example, the constituents explained in the embodiment described above can be replaced with substantially the same constituents, constituents exerting the same functions and advantages, or constituents capable of achieving the same object.

While there have been described what are at present considered to be certain embodiments of the invention, it will be understood that various modifications may be made thereto, and it is intended that the appended claims cover all such modifications as fall within the true spirit and scope of the invention.

What is claimed is:

1. An organic electroluminescence display device comprising:
   a plurality of pixels each including a lower electrode, a light emitting layer, and an upper electrode;
   a plurality of retroreflective bodies separated from each other, each of the retroreflective bodies located in each of the pixels and facing the lower electrode;
   an insulation layer lying between each of the retroreflective bodies and the lower electrode; and
   a pixel separation film adapted to section the pixels,
   wherein the lower electrode is located between the light emitting layer and each of the retroreflective bodies, and the pixel separation film is formed in an area corresponding to an area between a boundary between the pixels adjacent to each other and an outer periphery of each of the retroreflective bodies.

2. The organic electroluminescence display device according to claim 1, wherein
   each of the retroreflective bodies is formed of a plurality of retroreflective structures, each having an equilateral-triangular planar shape, and adjacent to each other.

3. The organic electroluminescence display device according to claim 2, wherein
   each of the retroreflective bodies is constituted by the plurality of retroreflective structures different in planar size from each other.

4. The organic electroluminescence display device according to claim 1, further comprising:
   a thin film transistor formed below the each of the retroreflective bodies so as to correspond to each of the pixels; and
   a contact hole adapted to connect the thin film transistor and the light emitting layer to each other and formed so as to correspond to each of the pixels,
   wherein the contact hole is formed inside the pixel separation film in a planar view.

5. The organic electroluminescence display device according to claim 1, wherein a plurality of pixel sets, each formed of a plurality of pixels different in planar shape from each other, is formed.

6. The organic electroluminescence display device according to claim 1, wherein
each of the retroreflective bodies has a hexagonal planar shape.

7. The organic electroluminescence display device according to claim 1, wherein
each of the retroreflective bodies is formed using a nanoimprint process.

8. The organic electroluminescence display device according to claim 1, wherein
the retroreflective bodies are portions of a layer formed of a material high in optical reflectance,
the layer includes a flat portion with no retroreflective property, next to the outer periphery of the retroreflective bodies, and
the pixel separation film sits above the flat portion.

9. An organic electroluminescence display device comprising:
a retroreflective body formed so as to correspond to each of pixels;
a plurality of organic electroluminescence elements formed on the retroreflective bodies so as to correspond to the pixels;
a pixel separation film adapted to section the pixels,
a thin film transistor formed below the retroreflective body so as to correspond to each of the pixels; and
contact holes, wherein each of the contact holes is adapted to connect the thin film transistor and the organic electroluminescence element to each other and formed so as to correspond to each of the pixels,
wherein the pixel separation film is formed in an area corresponding to an area between a boundary between the pixels adjacent to each other and an outer periphery of the retroreflective body,
each of the contact holes is formed inside the pixel separation film in a planar view,
the pixel separation film includes pedestal base sections, each of which is a part projecting from the boundary toward a center of the pixel in the planar view, so as to correspond respectively to the pixels,
each of the contact holes is located in the pedestal base section in the planar view, and
two or more of the contact holes are arranged so as to be adjacent to each other across the boundary in the planar view to thereby form a pedestal section having a plurality of the pedestal base sections adjacent to each other across the boundary.

* * * * *